US008555228B2

(12) United States Patent
Denler et al.

(10) Patent No.: US 8,555,228 B2
(45) Date of Patent: Oct. 8, 2013

(54) TOOL FOR GLITCH REMOVAL

(75) Inventors: Nicholas Denler, Beaverton, OR (US);
Iredamola Dammy Olopade, Portland, OR (US); Sunil Gupta, Hillsboro, OR (US); Sulakshana Shyama Nath, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/340,455

(22) Filed: Dec. 29, 2011

(65) Prior Publication Data
US 2013/0174107 A1    Jul. 4, 2013

(51) Int. Cl.
*G06F 17/50*    (2006.01)

(52) U.S. Cl.
USPC ........... 716/115; 716/102; 716/103; 716/106; 716/112; 716/113; 716/117; 716/136; 716/139

(58) Field of Classification Search
USPC ............... 716/102, 103, 106, 108, 112, 113, 716/115, 117, 136, 139; 703/14, 15
See application file for complete search history.

(56) References Cited

U.S. PATENT DOCUMENTS

| | | | |
|---|---|---|---|
| 5,650,938 A * | 7/1997 | Bootehsaz et al. ............ | 716/102 |
| 6,128,769 A * | 10/2000 | Carlson et al. ................ | 716/113 |
| 6,324,679 B1 * | 11/2001 | Raghunathan et al. ....... | 716/133 |
| 6,336,087 B2 * | 1/2002 | Burgun et al. ................. | 703/15 |
| 6,420,899 B1 * | 7/2002 | Crittenden et al. ............ | 326/30 |
| 6,567,773 B1 * | 5/2003 | Rahmat et al. ................. | 703/14 |
| 6,567,962 B2 * | 5/2003 | Baumgartner et al. ....... | 716/108 |
| 6,735,743 B1 * | 5/2004 | McElvain ...................... | 716/103 |
| 6,836,877 B1 * | 12/2004 | Dupenloup ................... | 716/103 |
| 6,973,420 B1 * | 12/2005 | Tetzlaff ............................ | 703/14 |
| 7,007,250 B1 * | 2/2006 | Bapat et al. .................... | 716/117 |
| 7,009,437 B2 * | 3/2006 | Fletcher et al. ................ | 327/175 |
| 7,010,763 B2 * | 3/2006 | Hathaway et al. ............ | 716/132 |
| 7,039,887 B2 * | 5/2006 | Khalil et al. ................... | 716/108 |
| 7,062,736 B2 * | 6/2006 | Oleksinski et al. ........... | 716/108 |
| 7,082,582 B1 * | 7/2006 | Borkovic et al. ............. | 716/103 |
| 7,082,584 B2 * | 7/2006 | Lahner et al. ................. | 716/102 |
| 7,254,793 B2 * | 8/2007 | Chen et al. .................... | 716/108 |
| 7,333,926 B2 * | 2/2008 | Schuppe ......................... | 703/15 |
| 7,346,867 B2 * | 3/2008 | Su et al. ......................... | 716/115 |
| 7,359,846 B1 * | 4/2008 | Fernandez ...................... | 703/13 |
| 7,380,228 B2 * | 5/2008 | Fry et al. ........................ | 716/103 |
| 7,484,192 B2 * | 1/2009 | Ja et al. .......................... | 716/106 |
| 7,484,196 B2 * | 1/2009 | Ja et al. .......................... | 716/108 |
| 7,590,953 B2 * | 9/2009 | Chang ............................ | 716/113 |
| 7,603,635 B2 * | 10/2009 | Sotiriou et al. ................ | 716/103 |
| 7,617,470 B1 * | 11/2009 | Dehon et al. ................... | 716/116 |

(Continued)

OTHER PUBLICATIONS

Hanken et al.; "Simulation and Modeling of Substrate Noise Generation from Synchronous and Asynchronous Digital Logic Circuits"; Publication Year: 2007; Custom Integrated Circuits Conference, 2007. CICC '07. IEEE, pp. 845-848.*

*Primary Examiner* — Helen Rossoshek
(74) *Attorney, Agent, or Firm* — Schwegman, Lundberg & Woessner, P.A.

(57) ABSTRACT

Embodiments of an electronic design automation system are generally described herein. In some embodiments, glitch-sensitive nodes in an integrated circuit design are identified. For each glitch-sensitive node, a circuit fanin cone is analyzed to look for circuit structures that can produce glitches. The integrated circuit design can be simulated and modified if the simulation indicates that a glitch would occur in the integrated circuit design.

15 Claims, 4 Drawing Sheets

(56) References Cited

U.S. PATENT DOCUMENTS

| | | | |
|---|---|---|---|
| 7,681,019 B1* | 3/2010 | Favor | 712/227 |
| 7,877,717 B2* | 1/2011 | Chu et al. | 716/100 |
| 7,996,802 B2* | 8/2011 | Ikeda et al. | 716/106 |
| 8,015,528 B2* | 9/2011 | Baumgartner et al. | 716/111 |
| 8,030,968 B1* | 10/2011 | Avner et al. | 326/85 |
| 8,069,428 B1* | 11/2011 | Ogami et al. | 716/117 |
| 8,219,945 B2* | 7/2012 | Wang et al. | 716/103 |
| 8,250,500 B1* | 8/2012 | Neto et al. | 716/101 |
| 8,331,176 B2* | 12/2012 | Mozak et al. | 365/201 |
| 2007/0220453 A1* | 9/2007 | Tobita | 716/1 |
| 2010/0242003 A1* | 9/2010 | Kwok | 716/5 |
| 2011/0184713 A1* | 7/2011 | Yang | 703/13 |

\* cited by examiner

TOOL FOR GLITCH REMOVAL

TECHNICAL FIELD

Embodiments pertain to design tools for integrated circuits (ICs), and more particularly to design tools for modifying IC designs to remove sources of glitches.

BACKGROUND

ICs comprise a collection of components such as transistors and resistors fabricated on a semiconductor substrate and connected together with conductive interconnections (e.g., metal, polysilicon, or including one or more other materials). Such interconnects can be referred to as "nets." A combination of components and nets can form a system such as a microprocessor. In a digital or mixed-mode IC, small groups of transistors or other components form a gate or other element that can implement a logic function. Such a gate, or a group of gates can be referred to as a "cell."

Cells may be standardized and selected from a cell library, allowing re-use of various logic functions across a design or between designs. Examples of cells can include inverters, OR gates, AND gates, exclusive OR (XOR) gates, NOT AND (NAND) gates, multiplexers, registers such as latches or flip-flops, adders, memories, or other more complex functions, such as including a combination of simpler elements structured in a hierarchical fashion. The logical arrangement of gates interconnected by nets can be used to synthesize a physical design comprising cells interconnected by physical nets. Such a physical design can then be fabricated on a semiconductor substrate to provide a functional IC.

Performance of the IC depends on its arrangement of cells and nets. The IC is designed by software packages called electronic design automation (EDA) tools that can be used to physically design or arrange cells, either using semi-automated physical layout, or in an automated fashion such as using one or more of a schematic design or a hardware description language. Such a design can then be simulated and modified in an iterative manner. In order to avoid costly design revisions, simulation such as formal verification can be used to verify that various representations of the design are equivalent.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Generally, in synchronous logic designs, signal transitions propagating through combinatorial logic generally stabilize in time to be synchronously and deterministically sampled at a receiving element (e.g., converging setup and hold timing analysis). In asynchronous circuits, however, instability, or "glitches" on these signals can trigger asynchronous events in downstream logic, or can be sampled prior to stabilization, in an unwanted manner. For example, a "glitch" can occur in an asynchronous circuit that may trigger unwanted events such as logical resets downstream from the origin of the glitch. A glitch can be associated with noise in a circuit, but can also be caused simply by variations in switching time or propagation delay in combinatorial logic circuits.

The inventors have observed, among other things, that verification escapes can occur if glitch-sensitive nodes in a design are not evaluated prior to fabrication of the design. For example, the inventors have recognized that at least sometimes, unwanted glitching behavior can be addressed by an electronic design automation (EDA) tool that can include manual or automated identification of glitch-sensitive nodes during the design phase. For example, an identified glitch-sensitive node can be simulated across a range of functional operating scenarios to verify that unwanted downstream behavior will not occur, or the design can be modified to correct the logic to suppress a glitch that might propagate to the glitch-sensitive node.

Figure 1A:
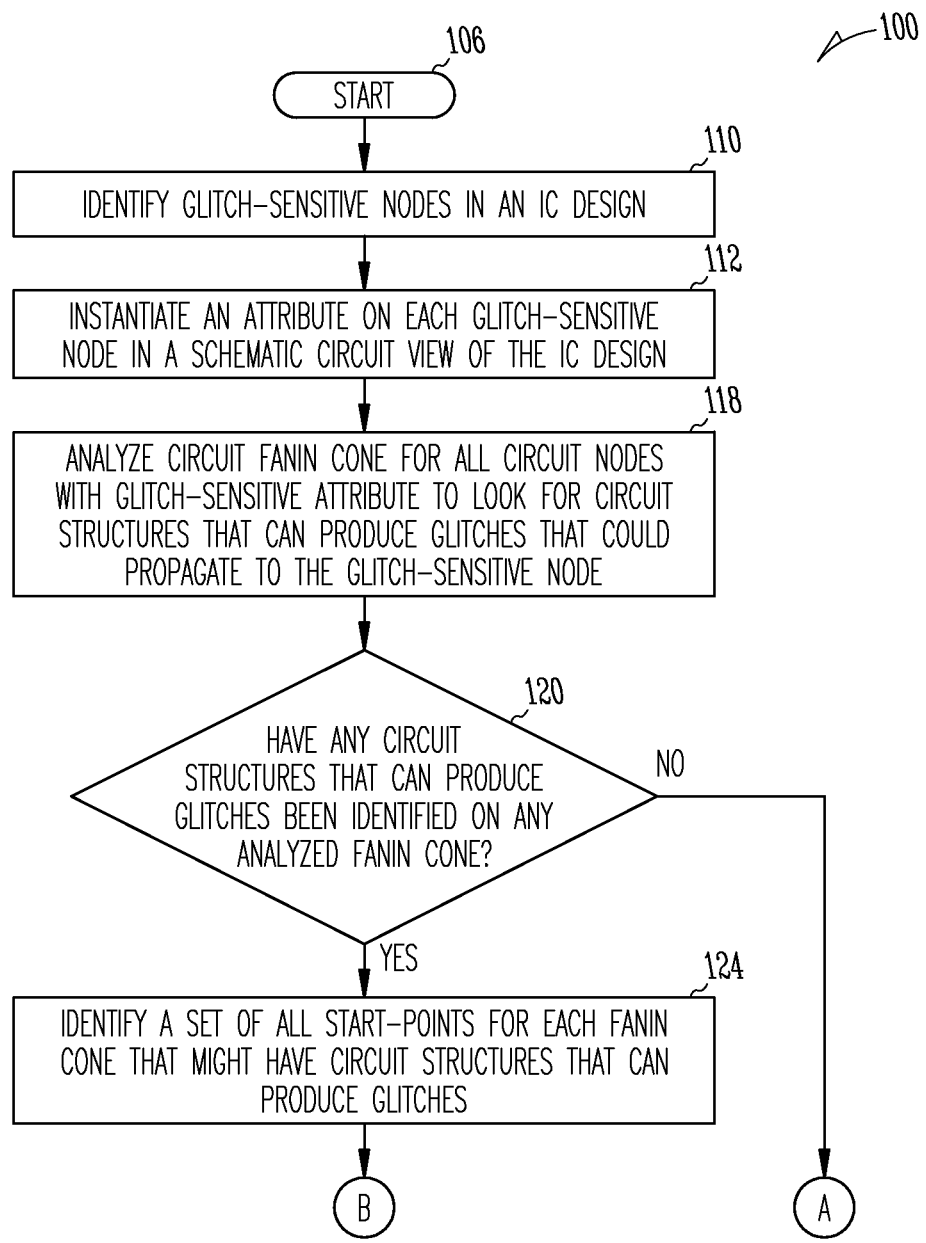
FIGS. 1A and 1B are a flow diagram of one method in accordance with some embodiments.
Figure 1B:
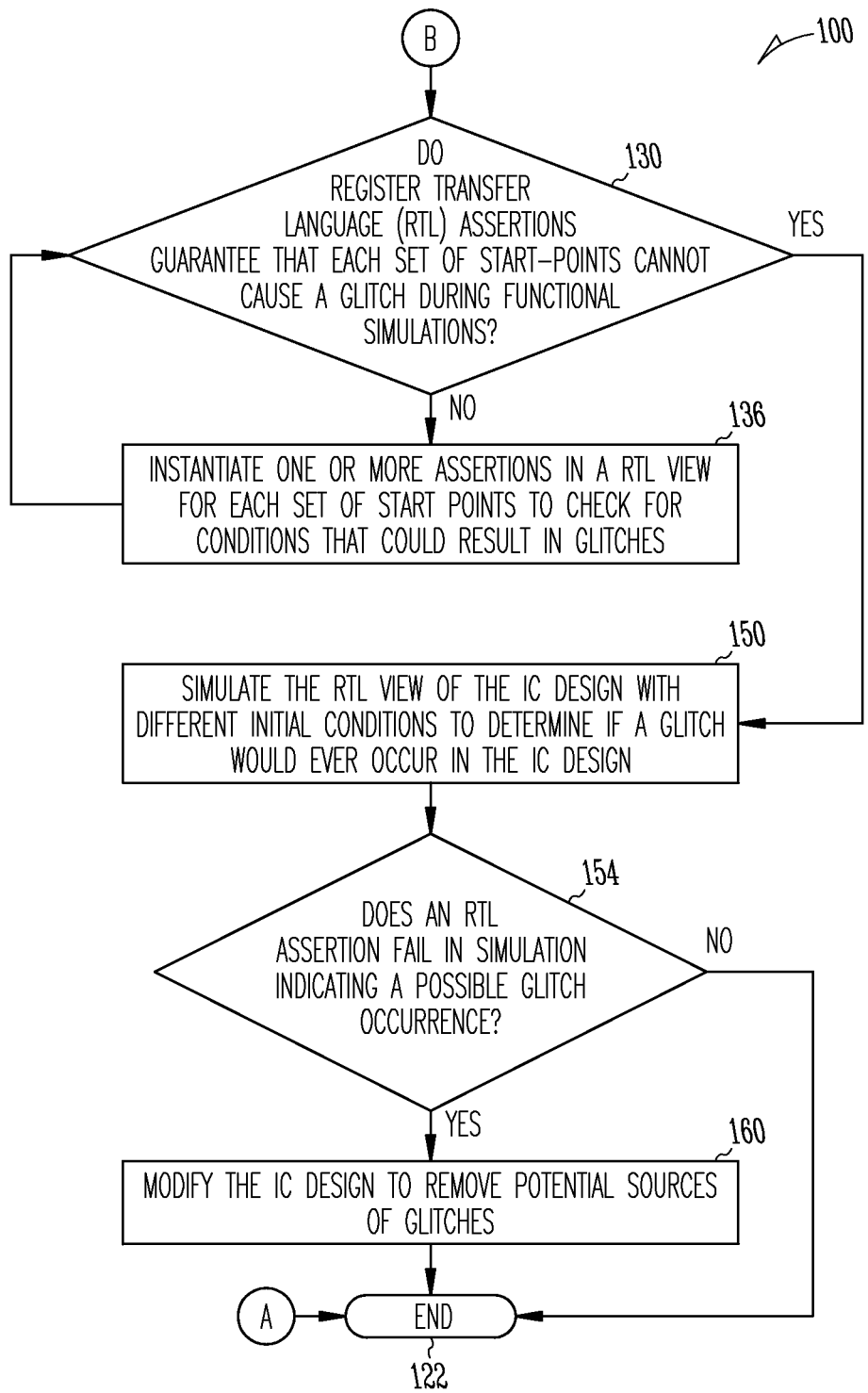

FIGS. 1A and 1B are a flow diagram of one method 100 in accordance with some embodiments. In block 106, the method 100 starts. In block 110, glitch-sensitive nodes are identified in an IC design. Glitch-sensitive nodes can include nodes of cells that are known to be sensitive to glitches such as cells with asynchronous ports such as a flip-flop or a latch. Glitch-sensitive nodes can also be identified directly by a circuit designer. In block 112, an attribute is instantiated on each glitch-sensitive node in a schematic circuit view of the IC design. The schematic circuit view can be used to represent at least a portion of the logic of the IC design. Such a schematic can be generated or stored as a portion of a design database. An attribute is an annotation in the schematic circuit view that can be associated with a particular object in the schematic view, such as a net (e.g., a glitch sensitive node), or a logical primitive corresponding to a cell, such as a gate. In block 118, a circuit fanin cone for all circuit nodes with a glitch-sensitive attribute is analyzed to look for circuit structures that can produce glitches that could propagate to the glitch-sensitive node. A fanin cone includes all of the upstream logic that converges on a node such as a glitch-sensitive node. A glitch-sensitive node can receive a signal from any of the logic in the fanin cone.

In block 120, the method 100 determines if any circuit structures that can produce glitches have been identified in any analyzed fanin cone. If no circuit structures were found that could produce glitches, the method 100 ends in block 122.

If a circuit structure that can produce glitches is identified in a fanin cone in block 120, then a set of all start-points for each fanin cone that might have circuit structures that can produce glitches is identified in block 124. A fanin cone has one or more start-points that can be driven inputs. Intermediate nodes between the start-points and the glitch-sensitive node are not start-points of the fanin cone. Glitches can be produced in the fanin cone when one or more signals driven from the start-points interact with the logic. Glitches can be produced by signal transitions through cells such as AND and OR gates. For example, AND gates and OR gates can produce glitches if their respective inputs toggle in opposite directions.

A schematic or gate-level view need not be the only level of abstraction where glitch identification and suppression can be performed. In block 130, the method 100 determines if register transfer language (RTL) assertions in an RTL view of the IC design will guarantee that each set of start-points cannot cause a glitch during functional simulations. The IC design may be simulated using the RTL view that is located in a database. The assertions state that, while logic structure exists that may cause glitches, the signal vectors that would produce the glitches never occur in operation. The assertions can be constructed in a variety of forms, syntaxes, or coding languages. For example, an assertion can state that no more than one of the start-points, out of the complete set of reported start-points for each fanin cone, can toggle at any given time or within any given period. The simulations of the RTL view either prove the assertions to be true or show them to be false. If one or more assertions are shown to be false, the IC design can be modified as is described below.

If the assertions are insufficient to guarantee that glitches will not occur, then the method 100 instantiates one or more assertions in the RTL view of the IC design for each set of start points in block 136 to check for conditions that could result in glitches, and the method returns to block 130. If the assertions can guarantee that glitches will not occur, then the method 100 proceeds to block 150 to simulate the RTL view of the IC design with different initial conditions to determine if a glitch would ever occur in the IC design.

The method 100 determines in block 154 if an RTL assertion failed in the simulation of block 150 indicating a possible glitch occurrence. If none of the RTL assertions failed in the simulation, the method ends in block 122. If one or more of the assertions failed in the simulation of block 150, the IC design can be modified in block 160 to remove potential sources of glitches. The IC design can be modified so that a glitch-sensitive node is no longer glitch-sensitive. For example, an asynchronous reset in a cell can be converted into a synchronous reset. Alternatively, the fanin cone of a glitch-sensitive node can be redesigned so that it does not contain structures that can produce glitches. For example, a flip-flop or a latch with a clock can be added to a fanin cone. The method 100 then ends in block 122.

Various embodiments may have more or fewer activities than those shown in FIGS. 1A and 1B. In some embodiments, the activities may be repeated, and/or performed in serial or parallel fashion. A waiver mechanism can be included in the method 100 to allow a circuit designer prevent one or more of the acts of the method 100 from occurring. The waiver mechanism allows the circuit designer to override the method 100.

Figure 2:
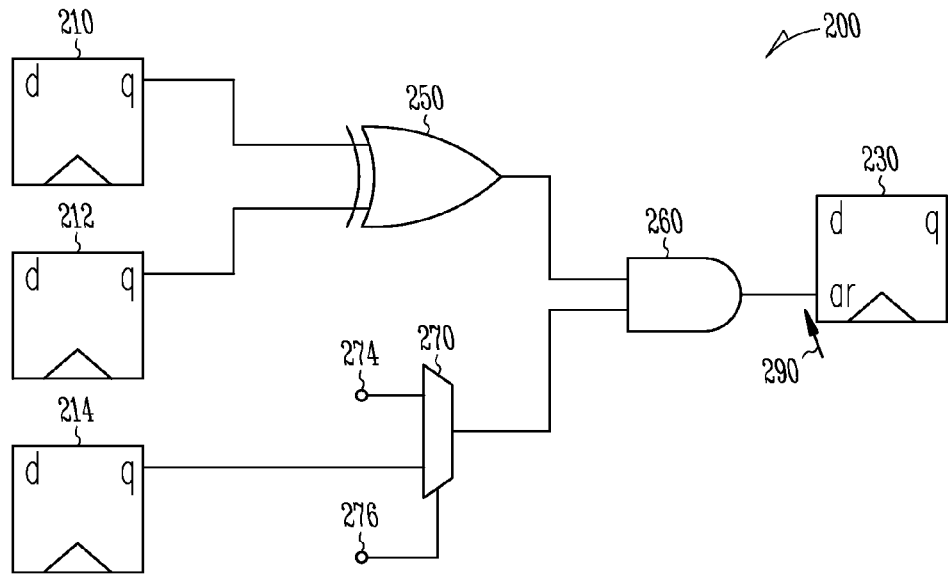
FIG. 2 is a schematic circuit view of an IC design in accordance with some embodiments.

FIG. 2 is a schematic circuit view of an IC design 200 in accordance with some embodiments. The underlying design includes physical cells and nets corresponding to the schematic view. The fanin cone of the IC design 200 includes four D flip-flops 210, 212, 214 and 230, each including a clock input, a D input and a Q output. The Q output of the D flip-flop 210 is connected to a first input of a NOT OR (NOR) gate 250 and the Q output of the D flip-flop 212 is connected to a second input of the NOR gate 250. An output of the NOR gate 250 is connected to a first input of an AND gate 260. The Q output of the D flip-flop 214 is connected to a first input of a multiplexer 270. A second input of the multiplexer 270 is connected to a first node 274 and a select input of the multiplexer 270 is connected to a second node 276. An output of the multiplexer 270 is connected to a second input of the AND gate 260. A node in the IC design 200 can be an input or an output of a cell, a connection to another design, a terminal, a bond pad or an input and/or output pin of the IC design 200.

An asynchronous reset (AR) port of the D flip-flop 230 is a glitch-sensitive node and is connected to an output of the AND gate 260. The AR port of the D flip-flop 230 has an attribute 290 attached to it as a result of the operation of the method 100 shown and described with reference to FIGS. 1A AND 1B. The D flip-flops 210, 212 and 214, the NOR gate 250, the AND gate 260 and the multiplexer 270 are within the fanin cone of the AR port of the D flip-flop 230. The start-points of the IC design 200 are the Q outputs of the D flip-flops 210, 212 and 214, the first node 274 and the second node 276.

Figure 3:
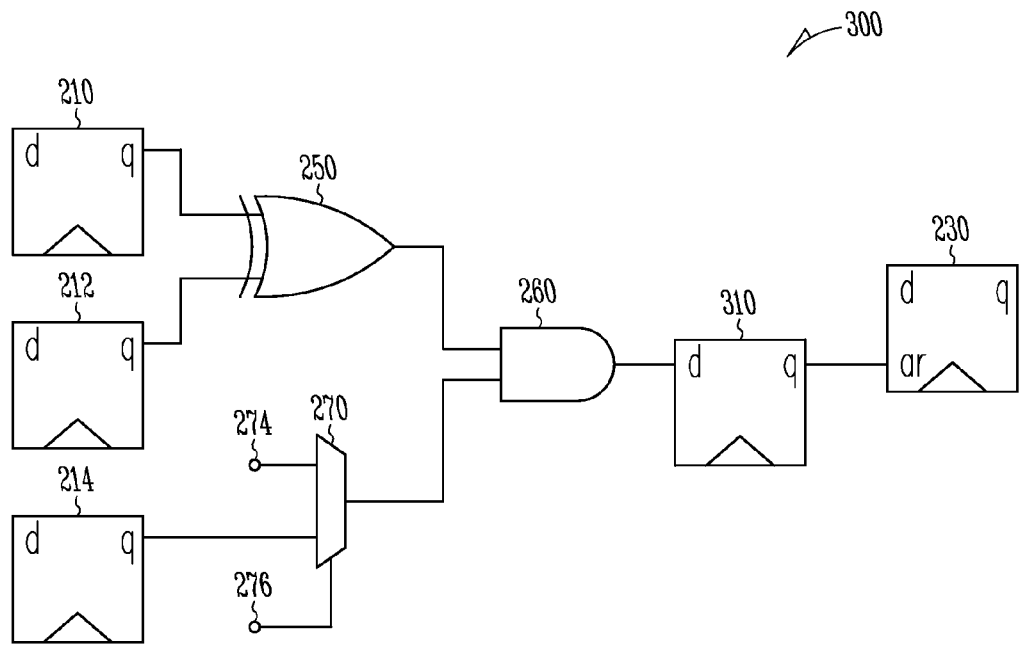
FIG. 3 is a schematic circuit view of an IC design in accordance with some embodiments.

FIG. 3 is a schematic circuit view of an IC design 300 in accordance with some embodiments. The IC design 300 includes all of the cells and nets of the IC design 200 shown in FIG. 2, and these cells and nets have the same reference numerals and will not be further described for purposes of brevity and clarity. The IC design 300 is a result of a modification of the IC design 200 by operation of the method 100 shown and described with reference to FIGS. 1A and 1B. In addition to the cells, nodes and wires of the IC design 200, the IC design 300 includes a D flip-flop 310 with a D input, a clock input and a Q output added by the method 100. The D input of the D flip-flop 310 is connected to the output of the AND gate 260, and the Q output of the D flip-flop 310 is connected to the AR port of the D flip-flop 230. The D flip-flop 310 can remove glitches that can be generated by the components of the IC design 200 so that they do not propagate to the AR port of the D flip-flop 230. This is an example of a redesign of a fanin cone of a glitch-sensitive node so that it does not contain structures that can produce glitches.

With reference to FIGS. 1A and 1B, the method 100 described above may be performed by a processor-based computer in accordance with some embodiments. The methods to be performed may constitute computer programs for a design tool made up of computer-executable instructions. The method shown above in FIGS. 1A and 1B is implemented in a computer-readable medium comprising computer-readable instructions for causing a computer to perform the method. Such a computer-readable medium may include software modules and computer programs. The computer-readable medium may be a floppy disk, a CD-ROM, or any other computer-readable medium known to those skilled in the art. The computer programs may comprise multiple modules or objects to perform the methods, or the functions of the methods. The type of computer programming languages used to write the code may vary from procedural code type languages to object oriented languages. Resulting files or objects need not have a one to one correspondence with the modules or method acts described depending on the desires of the programmer. Further, the methods and apparatus may comprise combinations of software, hardware and firmware as is well known to those skilled in the art. The description of the method with reference to a flowchart enables one skilled in the art with the benefit of the present description to develop programs including instructions to carry out the method on suitable computerized systems.

Figure 4:
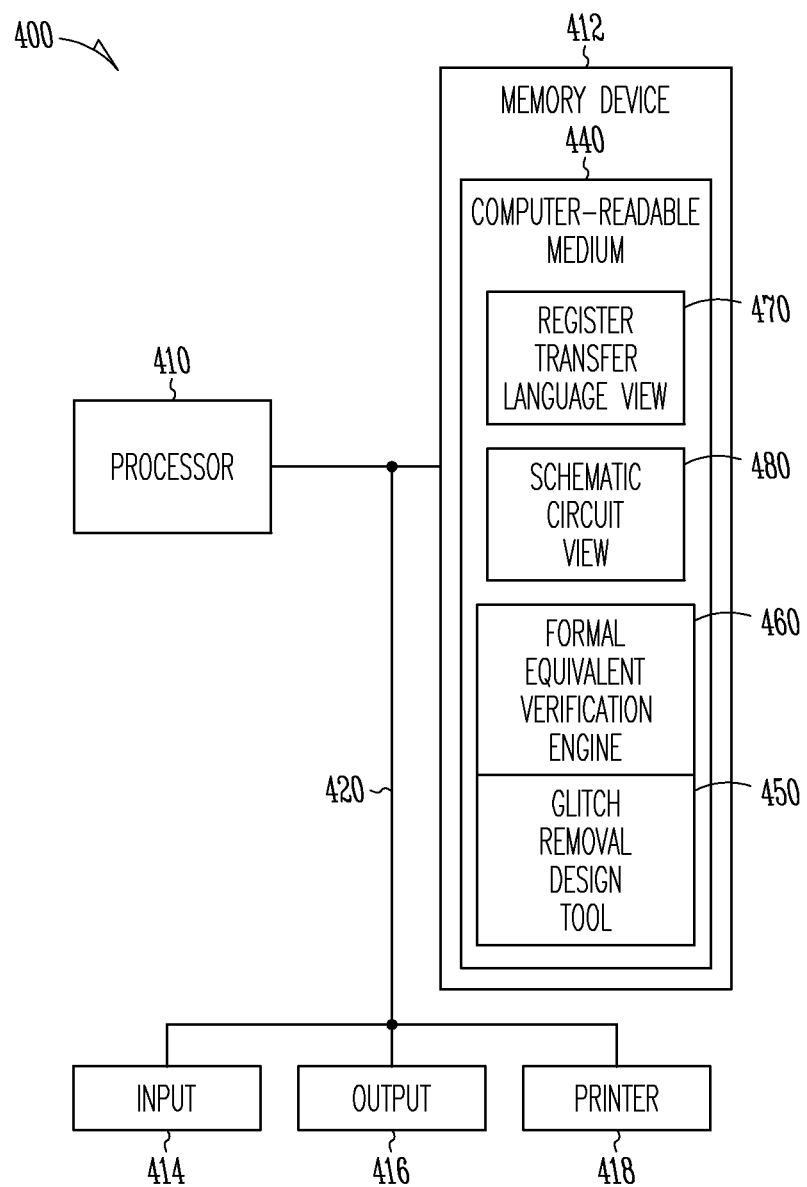
FIG. 4 is a block diagram of a computer system in conjunction with which embodiments described above may be implemented.

FIG. 4 is a block diagram of a computer system 400 in conjunction with which embodiments described above may be implemented. The system 400 includes a processor 410, a memory device 412, and I/O devices such as an input device 414, an output device 416 and a printer 418 that are coupled together by a bus 420 for communicating information. The printer 418 may or may not be included in the system 400. The memory device 412 includes a computer-readable medium 440 such as a magnetic disk comprising computer-readable instructions. The computer-readable instructions may comprise computer programs for a glitch removal design tool 450 in accordance with some embodiments. The computer-readable instructions may also comprise a formal equivalent verification engine 460, and the glitch removal design tool 450 may be appended to the formal equivalent verification engine 460. The formal equivalent verification engine 460 and the glitch removal design tool 450 may be referred to as modules. The computer-readable instructions may also comprise a RTL view 470 and a schematic circuit view 480 of the IC design in separate databases. The RTL view 470 and the schematic circuit view 480 may be referred to as modules. The memory device 412 may also include a hard disk drive, a floppy disk drive, an optical disk drive, or a tape cartridge drive, and is coupled to the bus 420 for storing data and instructions on the computer-readable medium 440 communicated over the bus 420. The output device 416 may be a monitor such as a liquid crystal device, a cathode ray tube, or other display device suitable for creating graphic images and/or alphanumeric characters recognizable to a user. The input device 414 may be a keyboard and may include alphanumeric and function keys coupled to the bus 420 for communicating information and commands to the processor 410. The printer 418 is coupled to the bus 420 to receive information from the processor 410 and to reproduce the information in a form recognizable to a user. Other I/O devices that may be coupled to the bus 420 include a pointing device such as a mouse. One skilled in the art with the benefit of the present description will recognize that more devices such as processors, memory devices, and I/O devices may be connected to the bus 420. The computer system 400 may also be configured in a different manner. The system 400 may be a server.

Any of the circuits or systems described herein may be referred to as a module. A module may comprise a circuit and/or firmware according to various embodiments.

The inventors believe that one or more of the various embodiments of the invention shown and described herein can be used to, for example, detect and remove circuit structures that can produce glitches in an IC design before the IC design is fabricated.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. At least one non-transistory machine readable medium comprising a plurality of instructions that in response to being executed on a computing device, cause the computing device to:
   identify a glitch-sensitive node in an integrated circuit design;
   add a logical attribute to the glitch-sensitive node included in an electronic design tool database;
   in response to identifying the glitch-sensitive node, analyze a circuit fanin cone of the glitch-sensitive node to look for circuit structures that can produce glitches that could propagate to the glitch-sensitive node;
   simulate the integrated circuit design in a register transfer language (RTL) view to determine when a glitch would occur in the integrated circuit design; and
   modify the fanin cone of the glitch-sensitive node so that the fanin cone does not contain, structures that can produce glitches when the simulation indicates that a glitch would occur in the integrated circuit design.

2. The non-transistory machine readable medium of claim 1, comprising a plurality of instructions that in response to being executed on the computing device, cause the computing device to identify a set of all start-points in the fanin cone if the fanin cone includes circuit structures that can produce glitches.

3. The non-transistory machine readable medium of claim 1 wherein modifying the integrated circuit design comprises automatically modifying the integrated circuit design so that the glitch-sensitive node is no longer glitch-sensitive.

4. The non-transistory machine readable medium of claim 1 wherein modifying the integrated circuit design comprises adding a cell with a clock to the integrated circuit design.

5. The non-transistory machine readable medium of claim 1, wherein modifying the integrated circuit design comprises adding a flip-flop to the integrated circuit design.

6. The non-transistory machine readable medium of claim 1, wherein modifying the integrated circuit design comprises adding a latch to the integrated circuit design.

7. The non-transistory machine readable medium of claim 1 wherein modifying the integrated circuit design comprises converting an asynchronous reset in a cell into a synchronous reset.

8. The non-transistory machine readable medium of claim 1 wherein identifying the glitch-sensitive node comprises identifying cells in the integrated circuit design that are known to be sensitive to glitches.

9. The non-transistory machine readable medium of claim 1 wherein identifying the glitch-sensitive node further comprises permitting a user to identify a glitch-sensitive node.

10. At least one non-transistory machine readable medium comprising a plurality of instructions that in response to being executed on a computing device, cause the computing device to:
    mark nodes in an integrated circuit design as glitch-sensitive nodes;
    simulate the integrated circuit design; and
    analyze a fanin cone for each glitch-sensitive node to look for circuit structures that can produce glitches and, for each glitch-sensitive node, to modify the fanin cone of the glitch- sensitive node so that the fanin cone does not contain structures that can produce glitches when a simulation of the integrated circuit design indicates that a glitch would occur in the integrated circuit design.

11. The non-transistory machine readable medium of claim 10 wherein the instructions comprise:
    a schematic circuit view;
    a register transfer language (RTL) view of the integrated circuit design; and
    a glitch removal design tool.

12. At least one non-transistory machine readable medium comprising a plurality of instructions that in response to being executed on a computing device, cause the computing device to:
    mark nodes in an integrated circuit design that are glitch-sensitive nodes;
    identify circuit structures that can produce glitches that could propagate to one of the glitch-sensitive nodes;
    simulate the integrated circuit design; and
    for each glitch-sensitive node, modify a fanin cone of the glitch-sensitive node so that the fanin cone does not contain structures that can produce glitches when the simulation indicates that a glitch would occur in the integrated circuit design.

13. The non-transistory machine readable medium of claim 12 wherein identifying circuit structures further comprises identifying a set of start-points in the fanin cone of each glitch-sensitive node that includes circuit structures that can produce glitches.

14. The non-transistory machine readable medium of claim 12 wherein modify the fanin cone of the glitch-sensitive node further comprises modify, the integrated circuit design so that the glitch-sensitive node is no longer glitch-sensitive.

15. The non-transistory machine readable medium of claim 12 wherein at least one of the glitch-sensitive nodes comprises an input to a cell.

* * * * *

UNITED STATES PATENT AND TRADEMARK OFFICE
CERTIFICATE OF CORRECTION

PATENT NO.       : 8,555,228 B2                                           Page 1 of 1
APPLICATION NO.  : 13/340455
DATED            : October 8, 2013
INVENTOR(S)      : Denler et al.

It is certified that error appears in the above-identified patent and that said Letters Patent is hereby corrected as shown below:

On the Title Page, under Item "(54) Title", line 1, delete "TOOL FOR GLITCH REMOVAL" and insert --DESIGN TOOL FOR GLITCH REMOVAL--, therefor In the Claims In column 5, line 65, in Claim 1, delete "contain," and insert --contain--, therefor In column 6, line 41, in Claim 10, delete "glitch- sensitive" and insert --glitch-sensitive--, therefor In column 7, line 6, in Claim 14, delete "modify," and insert --modify--, therefor Signed and Sealed this
Second Day of December, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,555,228 B2  Page 1 of 1
APPLICATION NO. : 13/340455
DATED : October 8, 2013
INVENTOR(S) : Denler et al.

It is certified that error appears in the above-identified patent and that said Letters Patent is hereby corrected as shown below:

On the Title Page, under Item "(54) Title", line 1, and in the Specification, Column 1, line 1, delete "TOOL FOR GLITCH REMOVAL" and insert --DESIGN TOOL FOR GLITCH REMOVAL--, therefor In the Claims In column 5, line 65, in Claim 1, delete "contain," and insert --contain--, therefor In column 6, line 41, in Claim 10, delete "glitch- sensitive" and insert --glitch-sensitive--, therefor In column 7, line 6, in Claim 14, delete "modify," and insert --modify--, therefor This certificate supersedes the Certificate of Correction issued December 2, 2014.

Signed and Sealed this
Twenty-third Day of December, 2014

Michelle K. Lee
*Deputy Director of the United States Patent and Trademark Office*